United States Patent [19]
Kim

[11] Patent Number: 6,021,088
[45] Date of Patent: Feb. 1, 2000

[54] GLOBAL WORDLINE DRIVER

[75] Inventor: Dae-Jeong Kim, Kyungki-Do, Rep. of Korea

[73] Assignee: LG Semicon Co., Ltd., Cheongju, Rep. of Korea

[21] Appl. No.: 09/198,274

[22] Filed: Nov. 24, 1998

[30] Foreign Application Priority Data

Jan. 23, 1998 [KR] Rep. of Korea ..................... 2016/1998

[51] Int. Cl.$^7$ ............................. G11C 8/00; G11C 16/04; G11C 7/00
[52] U.S. Cl. ............................... 365/230.06; 365/189.05; 365/203
[58] Field of Search ......................... 365/230.06, 230.08, 365/189.05, 203

[56] References Cited

U.S. PATENT DOCUMENTS

| | | | |
|---|---|---|---|
| 5,497,351 | 3/1996 | Oowaki | 365/230.03 |
| 5,513,148 | 4/1996 | Zagar | 365/233 |
| 5,774,409 | 6/1998 | Yamazaki et al. | 365/230.06 |
| 5,774,413 | 6/1998 | Hunt | 365/230.06 |
| 5,875,149 | 2/1999 | Oh et al. | 365/230.06 |

*Primary Examiner*—Trong Phan
*Attorney, Agent, or Firm*—Fleshner & Kim

[57] ABSTRACT

A wordline driver for use with a SDRAM of a semiconductor device is provided. The wordline driver can be used for a global wordline driver suitable for a merged bank architecture (MBA). The wordline driver can include a set unit for setting a wordline driver by receiving coding signals coded in an X-address predecoder. A reset unit resets the wordline driver in accordance with a reset signal controlled by a precharge command and a first coding signal. A drive unit enables/disables a wordline in accordance with operations of the set and reset units, and a latch unit latches an enabled/disabled state of the wordline. The coding signal can include upper, intermediate and lower coding signals based on a multi-bit X-address. Accordingly, the present invention is effective for the MBA in which the X-address predecoder is shared by providing a latch in a global wordline itself and latching an enabled/disabled state of the global wordline.

18 Claims, 2 Drawing Sheets

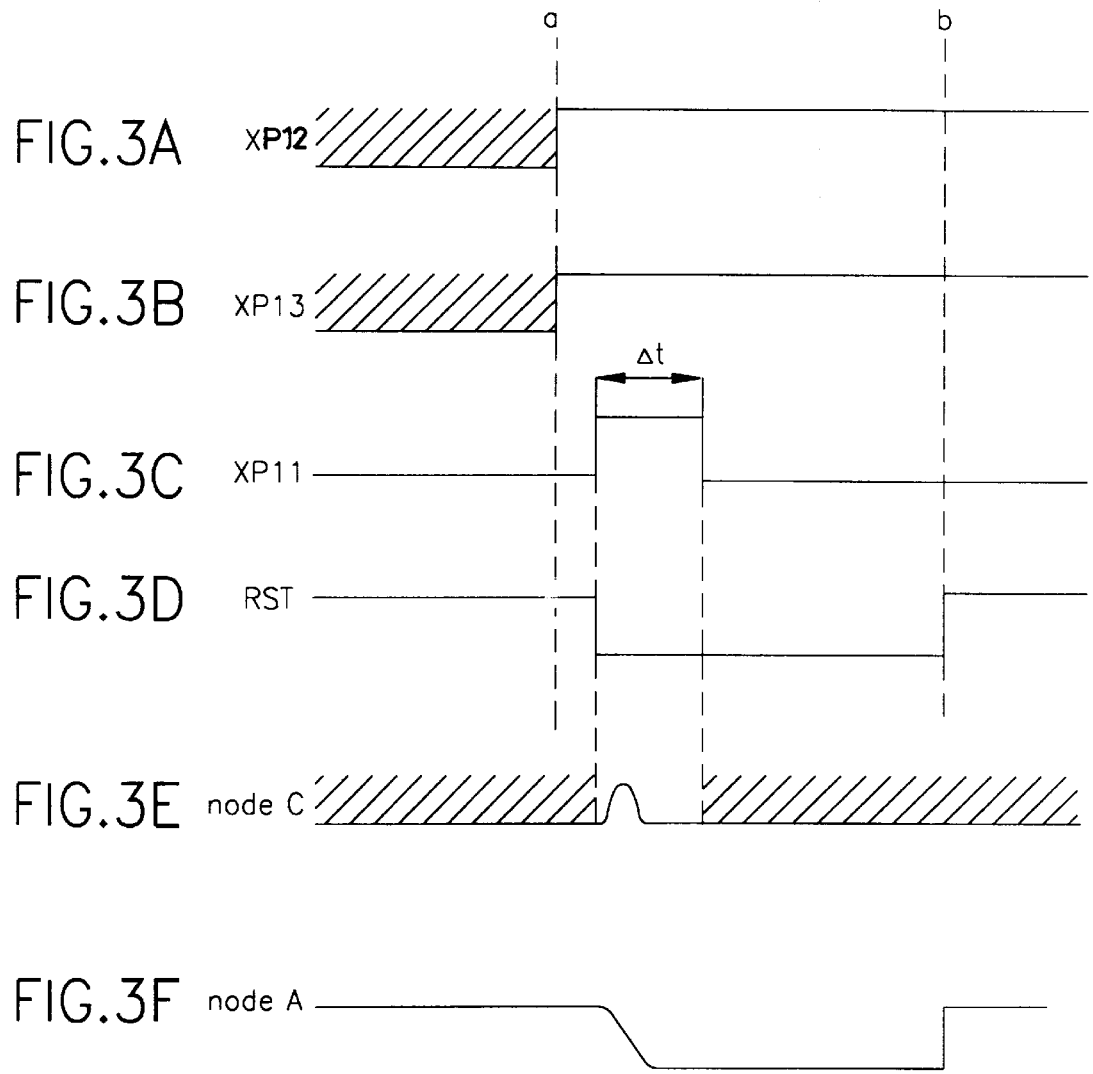

GLOBAL WORDLINE DRIVER

BACKGROUND OF THE INVENTION

1. Field of the Invention

The present invention relates to a semiconductor device, and in particular, to a wordline driver suitable for a merged bank architecture (MBA).

2. Background of the Related Art

As SDRAM has become highly integrated, it is essential to have a merged bank architecture (MBA) in which a memory chip is divided into a plurality of banks systems each of which has at least 4 banks, and an X-address predecoder or a control block is commonly owned by each divided banks. In this manner, an optimum size of the memory chip can be achieved.

An X-address predecoder (not shown) decodes an external address (i.e., X-address) in accordance with an active command to output a decoding signal. That is, for a 12 bit X-address B0–B11, the X-address predecoder outputs an upper coding signal XP1 by decoding bits B8–B11, an intermediate coding signal XP2 by decoding bits B5–B7, and a lower coding signal XP3 by decoding bits B0–B4.

FIG. 1 is a circuit diagram of a related art global wordline driver. As shown in FIG. 1, each of PMOS transistors PM1, PM2 serves as a switch for supplying a boosted voltage Vpp. The PMOS transistor PM1 and an inverter IN1 latch a disabled state of a global wordline. Each of NMOS transistors NM1, NM3 sets/resets the global wordline driver, and each of a PMOS transistor PM2 and a NMOS transistor NM2 drives the global wordline.

The operation of the related art global wordline driver will now be described. First, when the active command is inputted and the X-address predecoder (not shown) is set, the X-address predecoder decodes an inputted X-address and outputs upper, intermediate, and lower coding signals XP1, XP2, XP3, which are at low, low, and high levels, respectively. As a result, the NMOS transistor NM1 is turned on according to the lower coding signal XP3. Thus, a voltage of a node A becomes a Vss level and a voltage of a node B becomes a Vpp level. The NMOS transistor NM2 is turned on by the B node voltage at the Vpp level, and a global wordline signal GWLB becomes enabled at a low level.

Next, when a precharge command is inputted, the X-address predecoder (not shown) is reset. In this case, the upper, intermediate, and lower coding signals XP1, XP2, XP3 from the X-address predecoder become high, high, and low levels, respectively.

Accordingly, the NMOS transistor NM1 is turned off and the NMOS transistor NM3 is turned on. The PMOS transistor PM2 is turned on by the voltage of the node B at the Vss level, and thus the global wordline signal GWLB becomes disabled. Further, the disabled state of the global wordline is latched by the PMOS transistor PM1 and the inverter IN1. Thus, the related art global wordline driver drives the global wordline and latches the disabled state of the global wordline in accordance with set/reset operations of the NMOS transistor NM1 or the NMOS transistor NM3.

As described above, the related art global wordline driver has various disadvantages. There is no unit for latching an enabled state of the global wordline in the global wordline driver itself. Accordingly, when the global wordline is enabled, the coding signal from the X-address predecoder (not shown) can not be continuously applied thereto. Thus, the related art global wordline driver is not suitable for a semiconductor device such as an MBA in which the X-address predecoder is commonly owned.

The above references are incorporated by reference herein where appropriate for appropriate teachings of additional or alternative details, features and/or technical background.

SUMMARY OF THE INVENTION

An object of the present invention is to provide a global wordline driver that substantially obviates at least one of problems or disadvantages of the related art.

Another object of the present invention is to provide a wordline driver for semiconductor device having a common predecoder.

Another object of the present invention is to provide a wordline driver capable of latching enabled/disabled states of a wordline.

Another object of the present invention is to provide a wordline driver that latches enabled and disabled states of a global wordline for an MBA in which an X-address predecoder is commonly owned.

To achieve at least the above objects and other advantages in a whole or in parts and in accordance with the purpose of the present invention, as embodied and broadly described, a global wordline driver is provided that includes a drive unit that enables and disables a global wordline, a set unit that sets the drive unit using first, second and third signals, a reset unit that resets the drive unit using a fourth signal controlled by a precharge command and the first signal and a latch unit that latches both an enabled state and a disabled state of the global wordline.

To further achieve at least these objects in a whole or in parts and in accordance with the purpose of the present invention, as embodied and broadly described, a wordline driver for driving a global wordline in a memory device is provided that includes a latch that stores one of an enable and disable state, a control unit coupled to the latch unit that receives a plurality of signals such that the latch stores one of the enable and disable states and a drive unit coupled to the global wordline, wherein the drive unit is responsive to the latch unit such that the global wordline is enabled or disabled.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3A through 3F are diagrams showing timing waveforms for respective signals in the circuit of FIG. 2.

DETAILED DESCRIPTION OF PREFERRED EMBODIMENTS

Figure 1:
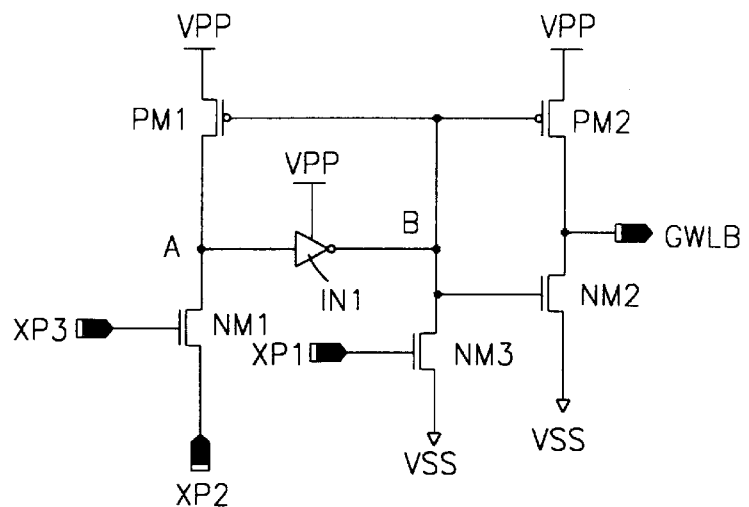
FIG. 1 is a circuit diagram showing a related art global wordline driver.
Figure 2:
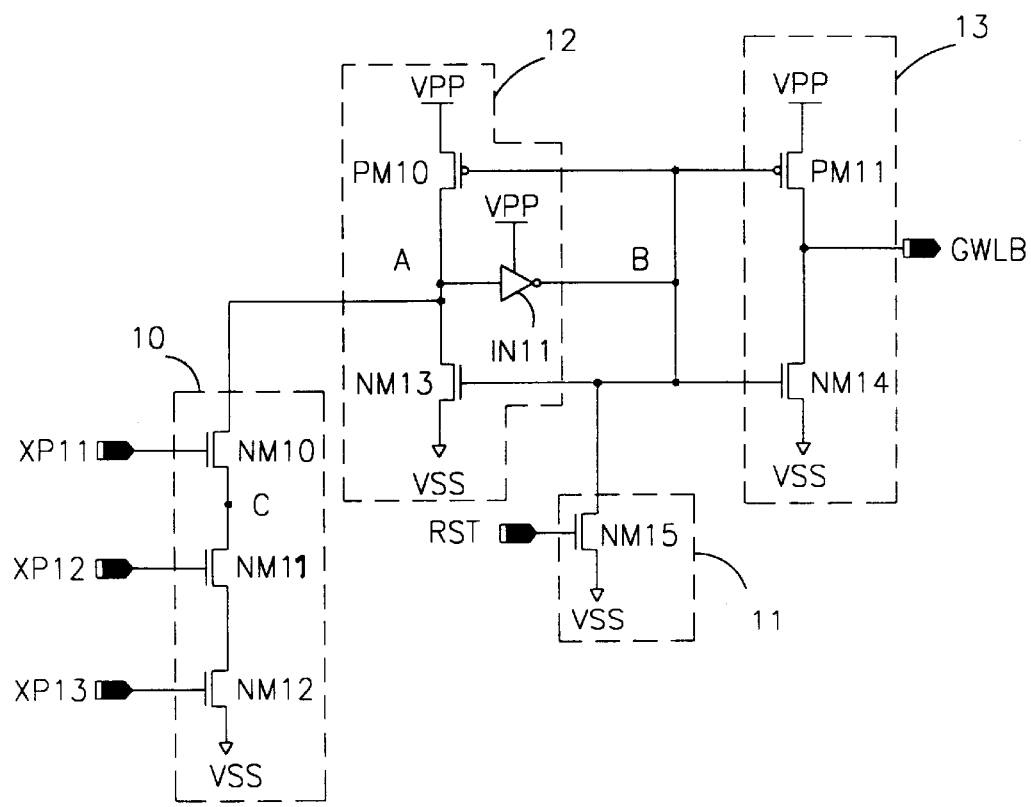
FIG. 2 is a circuit diagram showing a preferred embodiment of a global wordline driver according to the present invention.

FIG. 2 is a circuit diagram showing a wordline driver according to a preferred embodiment of the present invention. As shown in FIG. 2, a set unit 10 sets a global wordline and a reset unit 11 resets the same. A latch unit 12 latches an enabled/disabled state of the global wordline, and a drive unit 13 drives the global wordline in accordance with an output from the latch unit 12.

The set unit 10 includes NMOS transistors NM10, NM11, NM12 coupled in series between a node A and a ground Vss, and receives upper, intermediate, and lower signals XP11, XP12, XP13, respectively, outputted from an X-address predecoder (not shown). The reset unit 11 includes an NMOS transistor NM15 coupled between a node B and the ground Vss. Preferably, each transistor of the set and reset units 10, 11 applies a large-sized (e.g., W/L) transistor having a driving capacity larger than each transistor of an inverter IN11 in the latch unit 12 in order to determine a data value latched in the latch unit 12.

The latch unit 12 preferably includes a PMOS transistor PM10 and an NMOS transistor NM13 coupled in series between a boosted voltage terminal Vpp and the ground Vss and each serving as an inverter. The latch unit 12 further includes an inverter IN11 coupled between the node A and gates of the PMOS transistors PM10, PM11. The drive unit 13 includes the PMOS transistor PM11 and an NMOS transistor NM14 coupled between the boosted voltage terminal Vpp and the ground Vss. The PMOS transistor PM11 and the NMOS transistor NM14 have gates respectively coupled to the gates of the PMOS transistor PM10 and the NMOS transistor NM13. Each of the transistors of the latch unit 12 latching the global wordline driver is constructed as a small-sized (e.g., W/L) transistor, but each transistor of the drive unit 13 employs a large-sized (e.g., W/L) transistor in order to drive a plurality of sub-wordlines.

operations of the preferred embodiment of the global wordline driver according to the present invention will now be described. When an active command is inputted, the X-address predecoder (not shown) decodes each of preferably 12 predetermined bits of an X-address B0–B11 to output the upper, intermediate, and lower coding signals XP11, XP12, XP13, which are respectively at a prescribed level. The X-address predecoder preferably outputs the upper coding signal XP11 by decoding upper bits B8–B11 including a bank address, the intermediate coding signal XP12 by decoding intermediate bits B5–B7, and the lower coding signal XP13 by decoding lower bits B0–B4. In addition, a reset signal RST is set at a high level according to a precharge command and reset by the upper coding signal XP11. In addition, the upper coding signal XP11 is only enabled with respect to a bank selected by the bank address.

The intermediate and lower coding signals XP12, XP13 at a high level as respectively shown in FIGS. 3A and 3B are inputted at a time (a) according to the active command. After a predetermined time, the pulse-type upper coding signal XP11 at a high level is inputted for a predetermined time (e.g., Δt) as shown in FIG. 3C. The reset signal RST becomes a low level in accordance with the upper coding signal XP11 as shown in FIG. 3D.

Since the transistors NM11–NM12 of the set unit 10 are turned on initially by the intermediate and lower coding signals XP12, XP13 at the high level, a voltage of the node A drops to the Vss level as shown in FIG. 3F. A voltage of a node C in a floating state instantaneously rises when the NMOS transistor NM10 is turned on as shown in FIG. 3E and then drops to the Vss level.

The node A at the Vss level is inverted in the inverter IN11 and accordingly, the voltage of the node B becomes a Vpp level. The NMOS transistor NM14 is turned on in accordance with the voltage of the node B at the Vpp level, to enable a global wordline signal GWLB at a low level. Although the upper coding signal XP11 is reset after the pulse time (i.e., at), the enabled global wordline signal GWLB is maintained at the low level because the node A is latched at a low level by the inverter IN11 and the NMOS transistor NM13. That is, although the upper coding signal XP11 is reset, the enabled global wordline is latched. Thus, the upper coding signal XP11 is available and can be applied to select another bank.

When the precharge command is inputted and thus the reset signal RST is set at a high level at a time (b), the PMOS transistor PM11 is turned on in accordance with the Vss-level voltage of the node B. The global wordline signal GWLB becomes disabled at a high level. The disabled global wordline signal GWLB is latched by the inverter IN11 and the PMOS transistor PM10.

As described above, a preferred embodiment of a global wordline driver according to the present invention has various advantages. The preferred embodiment of a global wordline driver disables the global wordline not by resetting the X-address predecoder, but by using the reset signal RST controlled by the precharge command. Thus, the preferred embodiment of a global wordline driver can promptly reset the wordline because the preferred embodiment has smaller loading than a relative art system that resets the X-address predecoder.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A global wordline driver, comprising:
   a drive unit that enables and disables a global wordline;
   a set unit that sets the drive unit using first, second and third signals;
   a reset unit that resets the drive unit using a fourth signal controlled by a precharge command and the first signal; and
   a latch unit that latches both an enabled state and a disabled state of the global wordline.

2. The global wordline driver of claim 1, wherein the first, second and third signals are upper, lower and intermediate coding signals and the fourth signal is a reset signal.

3. The global wordline driver of claim 2, wherein the drive unit enables and disables the global wordline using output signals received from the set and reset units, and wherein the upper, lower and intermediate coding signals are X-address decoding signals.

4. The global wordline driver of claim 1, wherein the set unit comprises first, second, and third transistors connected in series between a first node and a first prescribed voltage, and wherein the reset unit comprises a fourth transistor connected between a second node and the first prescribed voltage.

5. The global wordline driver of claim 4, wherein the latch unit comprises:
   a fifth transistor and a sixth transistor connected between a second prescribed voltage and the first prescribed voltage having second electrodes connected together to form the first node and control electrodes connected together to form the second node; and a logic-gate having an input connected to the first node and an output connected to the second node.

6. The global wordline driver of claim 5, wherein each transistor of the set and reset units has a larger driving capacity than transistors of the latch unit to determine a data value latched in the latch unit.

7. The global wordline driver of claim 6, wherein the fifth transistor is a PMOS transistor, the first through fourth and sixth transistors are NMOS transistors, the logic-gate is an inverter, and the first and second prescribed voltages are ground and a boosted voltage, respectively.

8. The global wordline driver of claim 5, wherein each of the transistors of the latch unit has a smaller driving capacity than the transistors in the set and reset units.

9. The global wordline driver of claim 5, wherein the drive unit comprises a PMOS transistor and a NMOS transistor connected in series between the second and first prescribed voltages having control electrodes connected together that receive an output signal of the latch unit, and having second electrodes connected together to the global wordline.

10. The global wordline driver of claim 1, wherein the first signal comprises a bank address.

11. A wordline driver for driving a global wordline in a memory device, comprising:

a latch that latches one of an enable and disable state;

a control unit coupled to the latch unit that receives upper and low coding signals and drives said latch into said one of the enable and disable states, wherein the control unit resets the latch unit based on a reset signal independent of the upper coding signal; and a drive unit coupled to the global wordline, wherein the drive unit is responsive to said state of said latch unit such that the global wordline is enabled or disabled.

12. The wordline driver of claim 11, wherein the low coding signal comprises intermediate and lower coding signals, wherein the reset signal is initiated based on the upper and low coding signals, and wherein a duration of the reset signal is controlled by a precharge command to be greater than a duration of the upper coding signal.

13. The wordline driver of claim 11, wherein the control unit comprises:

a set unit that sets the drive unit using first, second and third signals;

a reset unit that resets the drive unit using a fourth signal controlled by a precharge command and the first signal.

14. The wordline driver of claim 13, wherein the latch unit comprises:

a first transistor and a second transistor connected between a first prescribed voltage and a second prescribed voltage having second electrodes connected together to form a first node and control electrodes connected together to form a second node; and a logic-gate having an input connected to the first node and an output connected to the second node.

15. A global wordline driver, comprising:

a driver that enables and disables a global wordline;

a set unit that sets the driver using upper and lower coding signals;

a reset unit that resets the driver using a reset signal, wherein the upper coding signal and the reset signal are pulse signals, and wherein the duration of the upper coding signal is shorter than the reset signal; and a latch that latches an enabled state of the global wordline.

16. The global wordline driver of claim 15, wherein the reset signal is initiated based on the upper coding signal, and wherein the duration of the reset signal is controlled by a prescribed command.

17. The global wordline driver of claim 16, wherein the reset signal is concurrently initiated by the upper coding signal, and wherein the duration of the reset signal is more than twice the duration of the upper coding signal.

18. The global wordline driver of claim 17, wherein the lower coding signal comprises low and intermediate coding signals, wherein the upper, intermediate and low coding signals are X-address decoding signals, wherein the latch further latches a disabled state of the global wordline, and wherein the prescribed command is a precharge command.

* * * * *